(12) United States Patent
Coots et al.

(10) Patent No.: US 8,151,449 B2
(45) Date of Patent: Apr. 10, 2012

(54) COMPONENT PLACEMENT MACHINE

(75) Inventors: Charles Andrew Coots, Binghamton, NY (US); James Daniel Lamuraglia, Binghamton, NY (US)

(73) Assignee: Universal Instruments Corporation, Binghamton, NY (US)

( * ) Notice: Subject to any disclaimer, the term of this patent is extended or adjusted under 35 U.S.C. 154(b) by 10 days.

(21) Appl. No.: 11/620,245

(22) Filed: Jan. 5, 2007

(65) Prior Publication Data
US 2008/0163484 A1   Jul. 10, 2008

(51) Int. Cl.
*B23P 19/00* (2006.01)
*H05K 13/04* (2006.01)

(52) U.S. Cl. .......................... 29/739; 29/729

(58) Field of Classification Search .............. 29/739–41, 29/742, 743
See application file for complete search history.

(56) References Cited

U.S. PATENT DOCUMENTS

| | | | |
|---|---|---|---|
| 6,427,320 B1 * | 8/2002 | Seto et al. | 29/740 |
| 6,493,931 B2 * | 12/2002 | Hirano et al. | 29/832 |
| 7,185,422 B2 * | 3/2007 | Sakai et al. | 29/832 |
| 7,278,204 B2 * | 10/2007 | Isogai et al. | 29/743 |
| 7,290,327 B2 * | 11/2007 | Nakano et al. | 29/740 |
| 7,299,540 B2 * | 11/2007 | Shimada | 29/743 |
| 7,353,594 B2 * | 4/2008 | Yoshida et al. | 29/833 |

* cited by examiner

*Primary Examiner* — David Angwin
(74) *Attorney, Agent, or Firm* — Schmeiser, Olsen & Watts, LLP

(57) ABSTRACT

A component placement machine for assembling at least one component on to at least one printed circuit board (PCB) is provided. The component placement machine comprises at least one head configured for picking a component from at least one feeder and placing the picked component on to a PCB of a first PCB product. The component placement machine also includes at least one feeder bank system separate from the head, wherein the feeder system includes a first feeder bank and a second feeder bank and a positioning system for moving both the entire first feeder bank and the entire second feeder bank in both a horizontal X direction and a perpendicular horizontal Y direction, wherein the feeder bank system is configured to enable a setup of a second PCB product on the component placement machine while the component placement machine assembles the PCB of the first PCB product. The entire first feeder bank and the entire second feeder bank of the at least one feeder bank system are each movably located on said component placement machine independently from each other, so that movement of the entire first feeder bank occurs while said component placement machine uses the second feeder bank to assemble said printed circuit board of said first printed circuit board product.

7 Claims, 9 Drawing Sheets

COMPONENT PLACEMENT MACHINE

BACKGROUND OF THE INVENTION

1. Technical Field

The present invention relates to a method and apparatus for assembling printed circuit boards (PCB). More particularly the present invention relates to a method and apparatus for changing from assembling PCBs of one type to assembling PCBs of another type quickly and cost effectively.

2. Related Art

Current product changeover processes on common PCB assembly lines typically utilize feeder bank carts and off-line setup tables and stations to prepare feeders for the next PCB for production on an assembly line. This feeder preparation is done in parallel (i.e. at the same time) with the assembly line production that is currently producing a different PCB and usually in order to reduce the changeover time from one PCB product to the next. By way of non-limiting example, FIG. 1 depicts three common operational areas for a typical PCB assembly site: component warehouse/crib 100, offline feeder setup area 200, and production line 300. Component warehouse 100 may be generally understood to be the storage area for the components for eventual assembly onto the various PCBs. Offline feeder setup area 200 may be generally understood to be a staging area where components are organized and loaded onto feeders and then placed on feeder bank carts. Production line 300 often comprises a screen printer, one or more component placement machines, an oven, and/or other peripherals.

FIG. 2 depicts typical steps that may be involved in a common product changeover process 400 for changing from one product to a next product on a production line, such as production line 300. Once production begins on a first product, step 401, setup and preparation, step 402, often begins in an offline feeder setup area, such as offline feeder setup area 200. To perform the setup and preparation in offline feeder setup area 200, step 402, components for the second product are typically retrieved from a component warehouse 100, or other storage area, and delivered to an offline feeder setup area, such as offline feeder setup area 200. The retrieved components are usually loaded onto feeders, and the feeders are then commonly placed into slots on to a feeder bank cart. Validation that the correct component is loaded on the correct feeder and that the correct feeder is located in the correct slot for the second product may occur when the feeders are in the offline feeder setup area 200. Once production of the first product completes, step 403, the remaining setup for the production of the second product generally begins. Accordingly, the feeders associated with the first product are typically removed from a pick and place PCB component assembly machine, or series of pick and place component placement machines in the production line 300, step 404, and board support pins, or other PCB support means, are often arranged in the machine(s) if needed, step 405. Additionally, the nozzle configuration may commonly be updated and nozzle maintenance may be performed, step 406. Moreover, the feeder bank carts, having been prepared in an offline feeder setup area, such as offline feeder setup area 200, may be brought to a production line, such as production line 300, and may be mounted and often validated on the machine, step 407. The production of the second product may then begin, step 408.

When the process of loading and validating at an offline feeder setup area 200 for the second product, is done concurrently and in parallel with the production of the first product at production line 300, the overall changeover time (the time production line 300 is not running a product) may be minimized to the time necessitated to: remove the first product feeder banks, step 404, arrange the board support pins, or other support mechanisms if necessary, step 405, possibly maintain/setup nozzles, step 406, and potentially mounting and/or validating the second product feeder banks, step 407. This changeover time incorporates unnecessary non-production time.

Floor space requirements and hardware costs are significant for procedures associated with common product changeover processes, such as non-limiting exemplary product changeover process 400. For every assembly machine in a production line, such as production line 300, a duplicate set of feeder carts is often required along with floor space to support offline feeder setup area 200, wherein the floor space often accommodates storage tables, setup stations, feeder storage carts, and/or other peripheral components. This equates to unnecessary floor space and a substantial amount of peripherals to support a typical production line 300.

Accordingly a need exists for a method that overcomes at least one of the aforementioned, and/or other, deficiencies in the art.

SUMMARY OF THE INVENTION

The present invention provides an apparatus and a product changeover method using said apparatus for improving the time and cost required to change from one PCB product to another PCB product produced on a PCB assembly line.

A first aspect of the present invention provides a component placement machine for assembling at least one component on to at least one printed circuit board, said component placement machine comprising: at least one head configured for picking said component from at least one feeder and placing said picked component on to a printed circuit board of a first printed circuit board product; and at least one feeder/nozzle bank system, wherein said feeder/bank system is configured to enable a setup of a second printed circuit board product on said component placement machine while said component placement machine assembles said printed circuit board of said first printed circuit board product.

A second aspect of the present invention provides a component placement machine feeder/nozzle bank system comprising: at least one feeder bank removably attachable to the component placement machine; and a positioning system configured for facilitating movement of said feeder bank as attached to the component placement machine.

A third aspect of the present invention provides a method for product changeover on a production line, the method comprising: retrieving at least one component from a component warehouse; delivering said component directly to at least one pick and place machine in said production line; and preparing said pick and place machine to run a second product while said pick and place machine is running a first product.

The foregoing and other features of the invention will be apparent from the following more particular description of various embodiments of the invention.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

Figure 1:
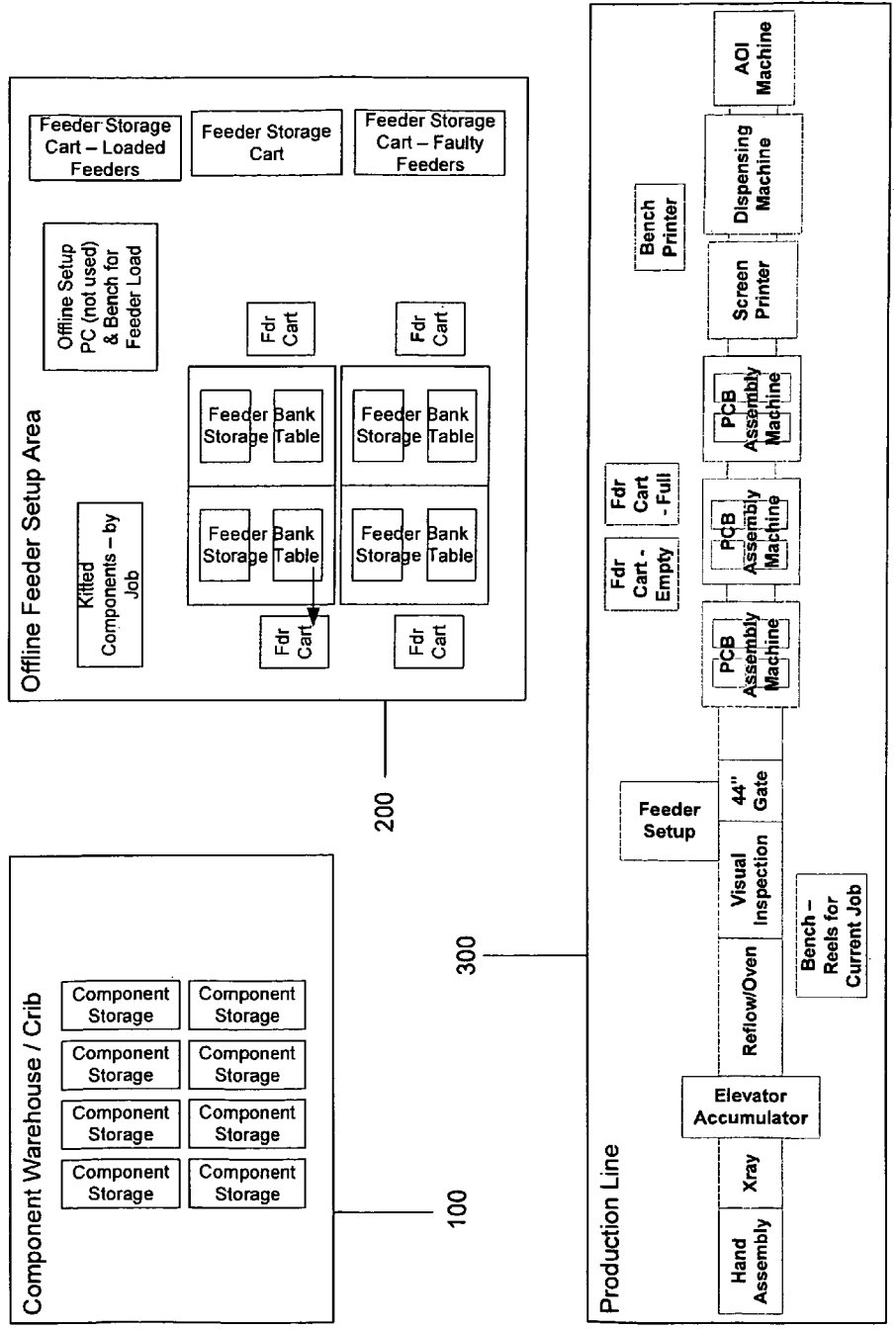
FIG. 1 depicts a schematic embodiment of common printed circuit board assembly operational areas.
Figure 2:
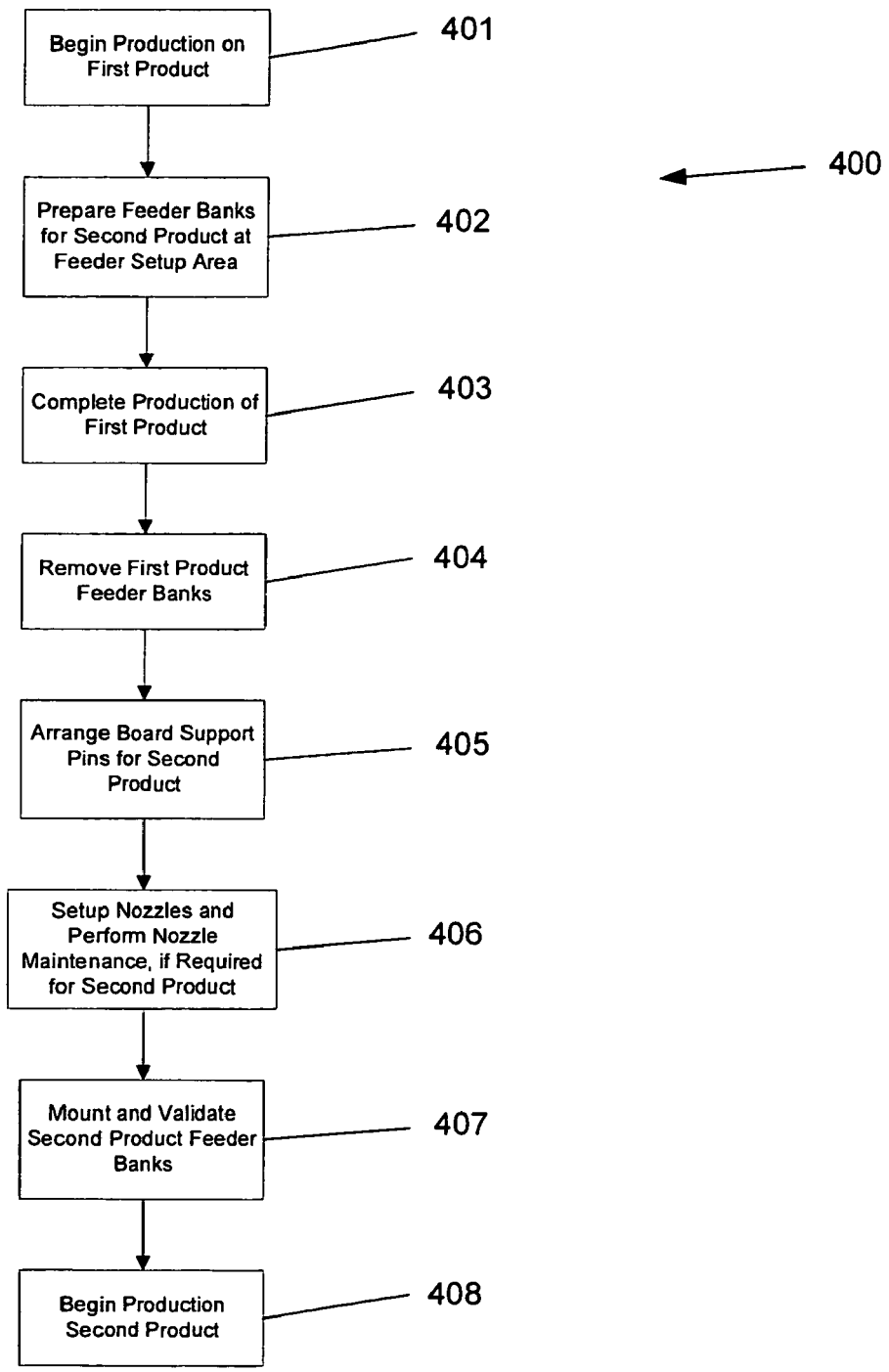
FIG. 2 depicts a flowchart of an embodiment of a common product changeover process of the related art.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

Embodiments of a product changeover apparatus of the present invention may utilize a feeder bank design that allows for the preparation for production of a second product on component placement machine, wherein the preparation is done concurrently and in parallel with the production of a first product on machine. Accordingly, the present invention may reduce the need for an off-line feeder setup area, such as off-line feeder setup area 200, and the requirement for storage tables, setup stations, feeder bank carts, and other peripherals, thereby resulting in a significant savings in floor space and capital investment for the customer and reduces the overall changeover time.

Figure 3:
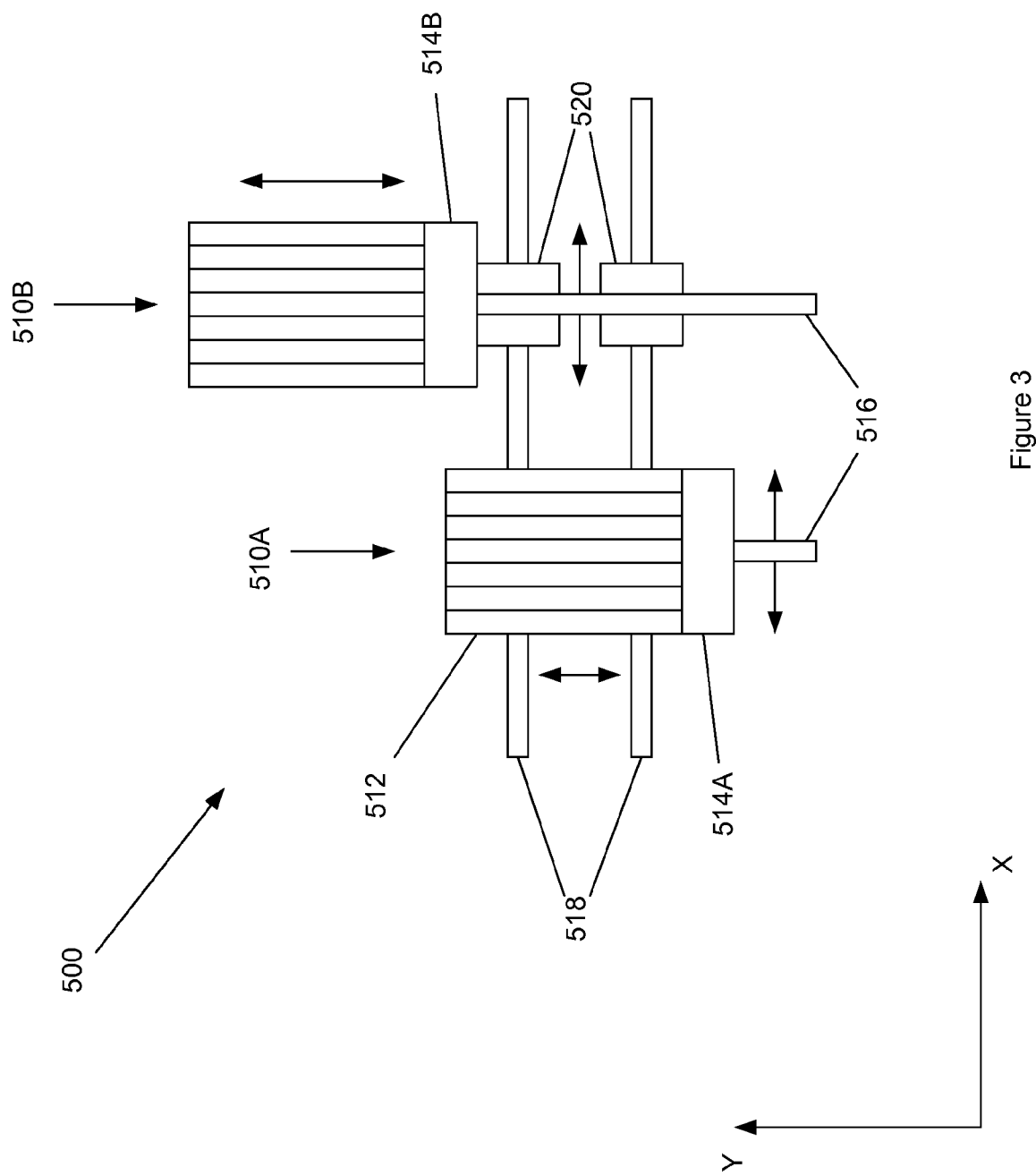
FIG. 3 depicts a top schematic view of an embodiment of a feeder bank system, in accordance with embodiments of the present invention.

Referring to the drawings, FIG. 3 depicts a top schematic view of a feeder/nozzle bank system 500 comprising banks 510A and 510B mounted on a positioning system comprising X axis and Y axis linear guides 518 and 516. Furthermore, mounted on the underside of banks 510A and 510B may be guide blocks (not shown) that may ride on the Y axis linear guides 516 which may allow banks 510A and 510B to move in the Y direction. Additionally, the Y axis linear guides 516 may be mounted to guide blocks 520 which may ride on X axis linear guides 518 which in turn may allow banks 510A and 510B to move in the X direction. Thus feeder/nozzle bank system 500 permits independent movement in the X and Y direction of banks 510A and 510B. The X axis linear guides 518 may be aligned substantially parallel with respect to each other. Moreover, the X axis linear guides 518 may be movable with respect to each other so that the substantially perpendicular distance between the guides may be increased or diminished. While, as embodied in FIG. 3, two X axis linear guides 518 are depicted, those in the art should recognize that a single X axis linear guide 518 may be utilized in conjunction with a single Y axis linear guide corresponding to a bank 510. Still further, it should be recognized that more than two X axis linear guides 518 may be provided and may be operable with a bank 510 to facilitate movement in a direction X. In further addition, those in the art should recognize that while the banks 510A and 510B are depicted as being operably connected to the Y axis linear guides 516 via guide blocks 520, roller bearings, linear slots, and/or other connection means may be provided to facilitate movement in accordance with the operable objectives of the present invention.

The banks 510A and 510B may each be located in one of three positions: a first position in which a bank 510A and/or 510B may be accessible to an operator; a second position in which a bank 510A, and/or 510B may be located at least partially within a component placement machine, such as component placement machine 600, wherein the bank 510A and/or 510B may or may not be accessible by a head, such as head 612 (see FIG. 4) for picking components; and, a third position in which a bank 510A and/or 510B may be located at least partially within a component placement machine, such as component placement machine 600 (see FIG. 4), and is accessible by a head 612 for picking components. Various positions relative to operation of feeder banks 510A and/or 510B will be described in greater detail in continued reference to FIG. 3 and with additional reference to FIGS. 4-11.

A bank 510 may comprise one or more feeder slots 512. Feeder slots 512 help locate feeders onto a bank 510. Although the feeders slots 512 are depicted as being arrayed horizontally, additional configurations for arranging feeders may be employed in a bank 510. Moreover banks 510A and 510B may also comprise nozzle changers 514A and 514B. A nozzle changer 514 may further comprise removable trays for storage of nozzles. Furthermore, the nozzle changers 514A and 514B themselves may be removable from the banks 510A and 510B.

Figure 4:
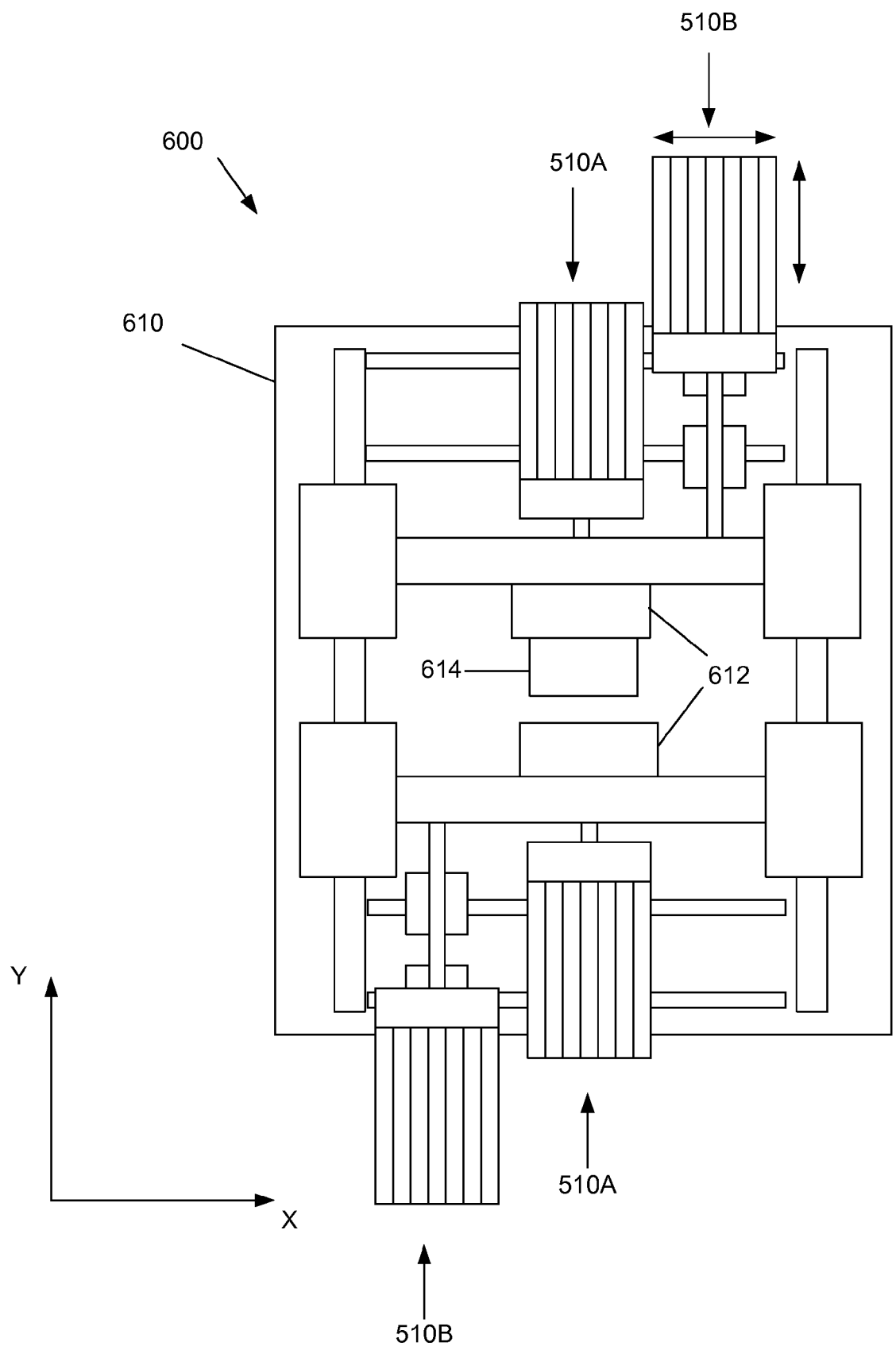
FIG. 4 depicts a top schematic view of an embodiment of a component placement machine including a feeder bank system.

With further reference to the drawings, FIG. 4 depicts a top schematic view of an embodiment of a component placement machine 600 including a feeder/nozzle bank system 500. Component placement machine 600 may comprise heads 612 for picking components from feeders mounted in feeder slots 512 (shown in FIG. 3) and operable with feeder banks 510A and 510B and placing the components onto a PCB 614. The operable configuration of feeder/nozzle bank system 500 may be such that when component placement machine 600 is assembling PCB 614 utilizing bank 510A for a first product, an operator may move bank 510B to a first position 540 that facilitates operator access to begin setup for a second product. The setup involving bank 510B may occur while the component placement machine 600 is assembling a first product PCB 614 utilizing electronic components pertinent to bank 510A.

Figure 5:
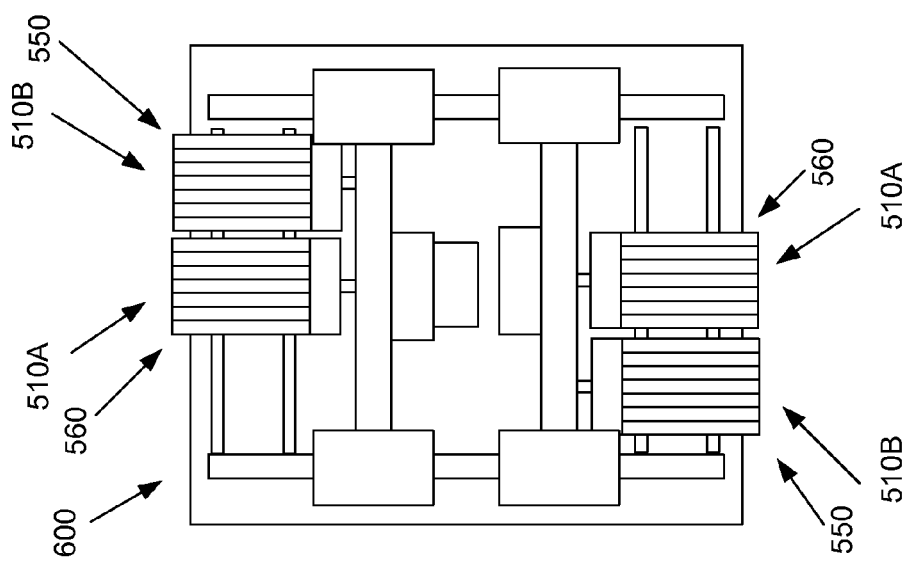
FIG. 5 depicts a first phase of an embodiment of the product changeover process, in accordance with the present invention.
Figure 8:
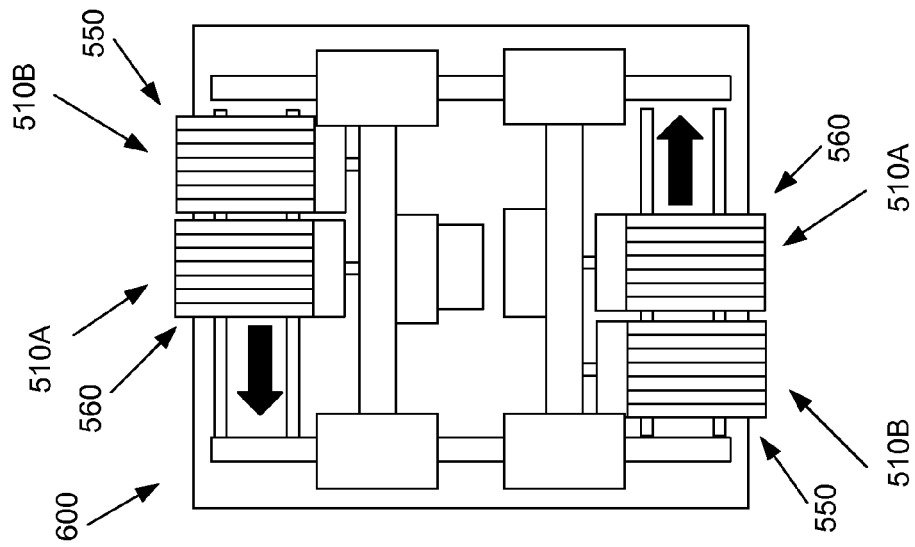
FIG. 8 depicts a fourth phase of an embodiment of the product changeover process, in accordance with the present invention.
Figure 7:
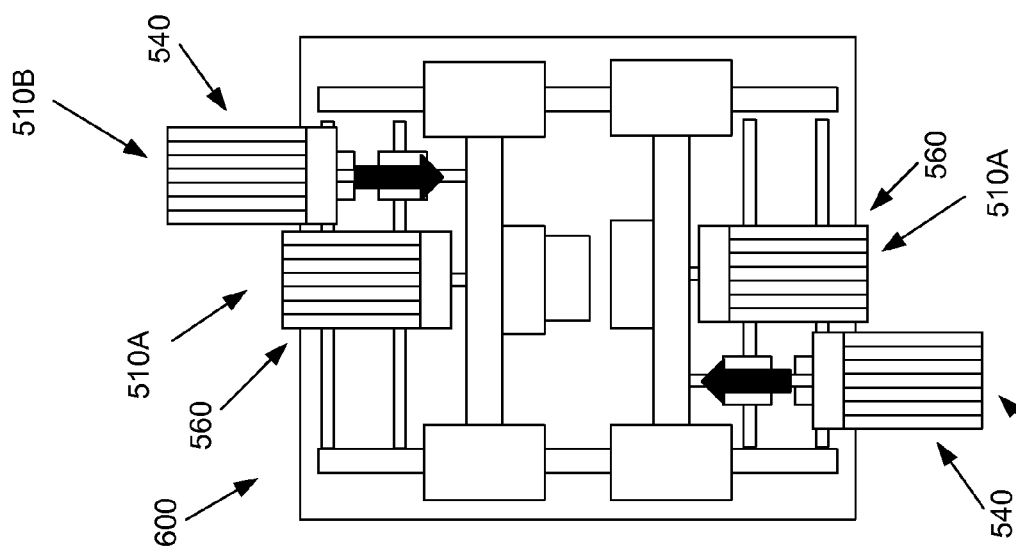
FIG. 7 depicts a third phase of an embodiment of the product changeover process, in accordance with the present invention.

FIGS. 5-11 show the possible movement of banks 510A and 510B during an embodiment of the product changeover process and method of using the product changeover apparatus including a component placement machine 600 having a feeder/nozzle bank system 500. Although banks 510A and 510B are depicted as being provided in symmetrical pairs on opposite sides of a component placement machine 600, those in the are should recognize that various banks 510 may be located at any operable position on either side of the component placement machine 600. In FIG. 5, a first phase of an embodiment of the product changeover process is depicted. The machine 600 may begin production of the first product such that all banks 510A and 510B are located either in a second position 550 or a third position 560 within machine 600. As depicted, banks 510B are located in a second position 550 and banks 510A are located in a third position 560. However, those in the are should appreciate that various banks 510 may be located in various positions 540, 550, 560. Accordingly, while one side of a component placement machine may have a bank 510B located in a second position 550 and a bank 510A located in a third position 560, the other side of the machine may have a bank 510C, (not shown but used for example) located in a first position 540 (see FIG. 6) and another bank 510D (also not shown but used for example) located in a third position 560. Thus the type of banks 510 and corresponding position 540-560 of the banks 510 may differ from one side of a component placement machine 600 to another and need not be symmetrical. However, for purposes of description, symmetry is depicted with respect to FIGS. 4-11.

Figure 6:
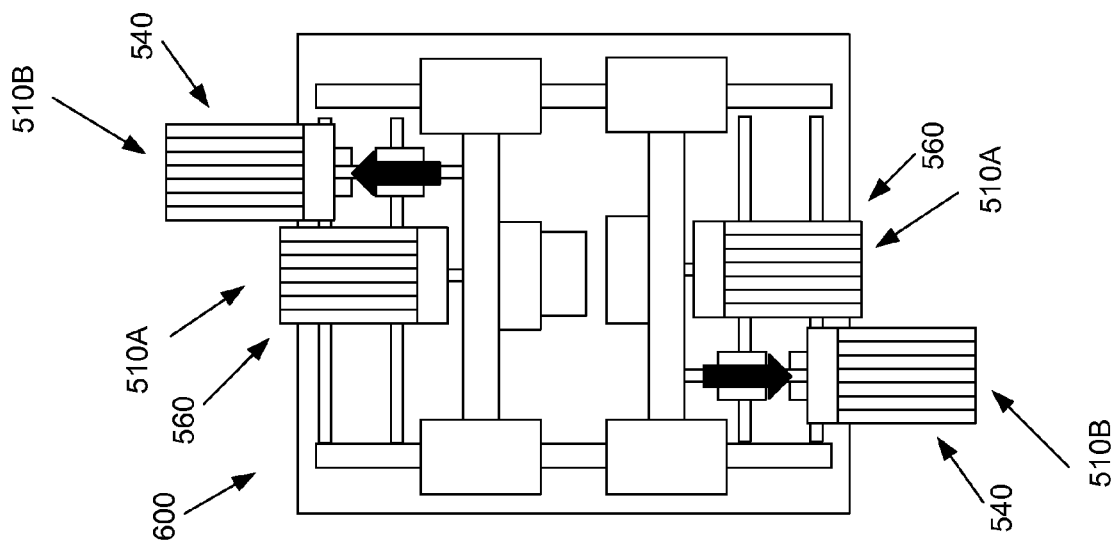
FIG. 6 depicts a second phase of an embodiment of the product changeover process, in accordance with the present invention.

Once production on the first product begins, the operator may move bank 510B to a first position 540 for ready component access by a head 612, as schematically depicted in FIG. 6, and begin the process of mounting and/or validating feeders on to bank 510B in preparation for production of a second product. In addition, the operator may update the nozzle configuration of various nozzles in nozzle changer 514 of bank 510B and perform any required nozzle maintenance. Once bank 510B is prepared and physically setup for the second product, the operator may move bank 510B from the first position 540 back to a second position 550 at least partially within component placement machine 600, such movement as depicted by the direction arrow label provided in FIG. 7. Upon completion of the first product, or when otherwise desired and directed, the operator may move bank 510A from a third position 560 to a second position 550, such movement as depicted by the direction arrow label provided in FIG. 8. While the banks 510A and 510B are split apart (not shown in FIG. 8, but implied via the direction arrow label of FIG. 8; such split configuration shown, however, in FIG. 9), board support pins or other PCB support means for the second product may be arranged because, inter alia, the pins or other support means may be more readily assessable by an operator when the banks 510A and 510B are each located in a second position 550. Accordingly, both banks 510A and 510B may be located in a second position 550 at the same time, wherein the second position 550 may be generally located toward either of the opposite ends of the X axis linear guides (referenced particularly in FIG. 3).

Figure 10:
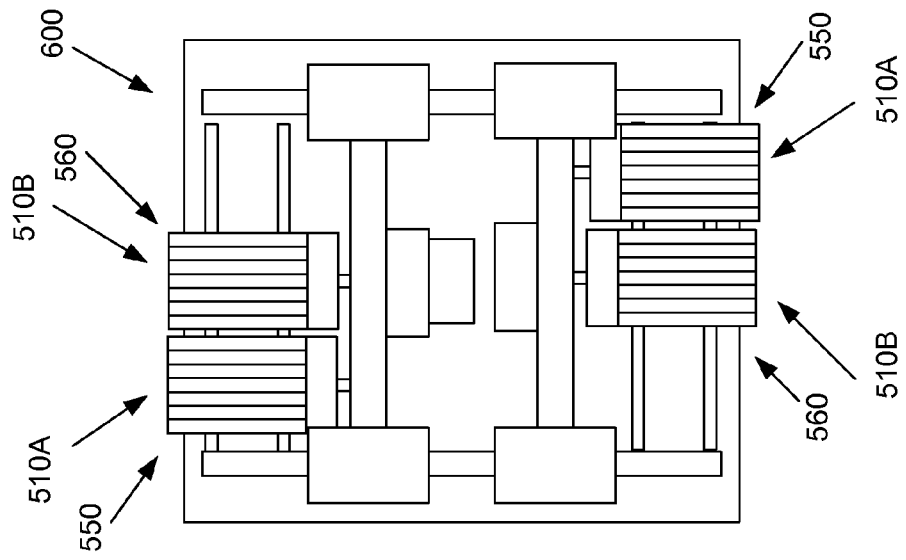
FIG. 10 depicts a sixth phase of an embodiment of the product changeover process, in accordance with the present invention.
Figure 9:
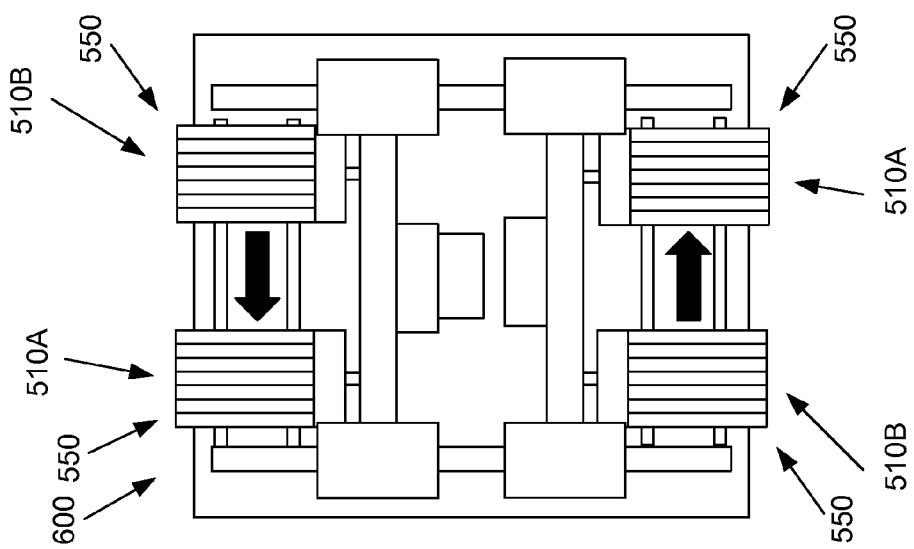
FIG. 9 depicts a fifth phase of an embodiment of the product changeover process, in accordance with the present invention.
Figure 11:
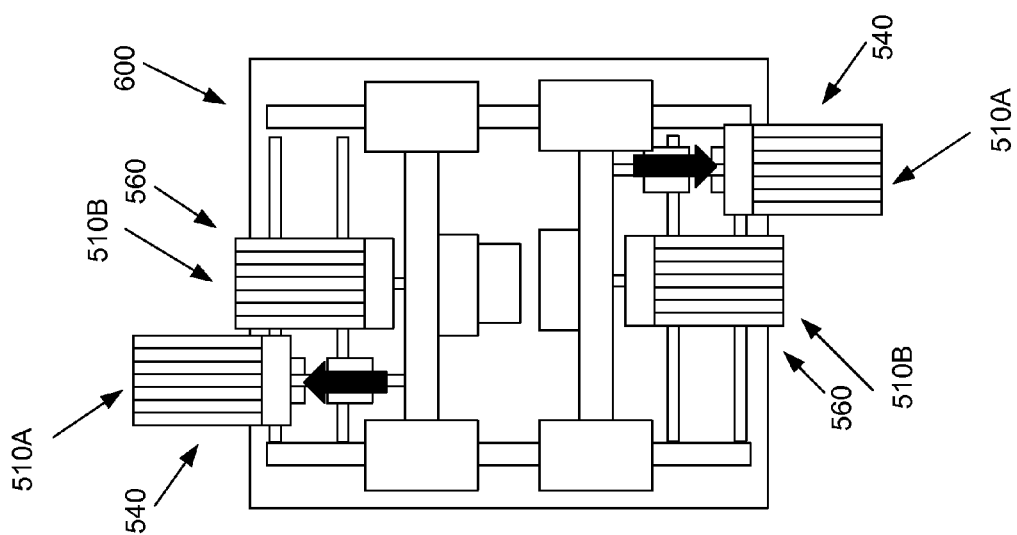
FIG. 11 depicts a seventh phase of an embodiment of the product changeover process, in accordance with the present invention; and, FIG. 12 depicts a flowchart of an embodiment of the product changeover process, in accordance with the present invention.

With the feeder bank 510A maneuvered out of the third position 560 and into a second position 550, the operator may move bank 510B from the second position 550 (see the direction arrow label shown in FIG. 9) to the third position, as depicted in FIG. 10, at which point production of the second product may begin or a production of the first product may resume, wherein such resumed production of the first product may then include the pick and placing of components contained in bank 510B. Where a component placement machine 600 includes a head, such as head 612 shown in FIG. 4, having capability to access a bank 510 located in a second position 550, it may be possible for the head of the machine 600 to pick components from feeders residing in banks 510, wherein the banks 510 may be located in either a second 550 or a third position 560. For example, one PCB product assembly may include components from feeders located in four different feeder banks 510, wherein two of the four feeder banks 510 are each located at a second position 550 on one side of a component placement machine 600 and the other two of the four feeder banks 510 are located on another side of the component placement machine 600 each located at a third position 560. Furthermore, with the bank 510A located in a second position 550, as depicted in FIG. 10, the operator may then also move bank 510A at least partially outside of machine 600 to a first position 540, as shown in FIG. 11, for preparation and setup of another product.

Figure 12:
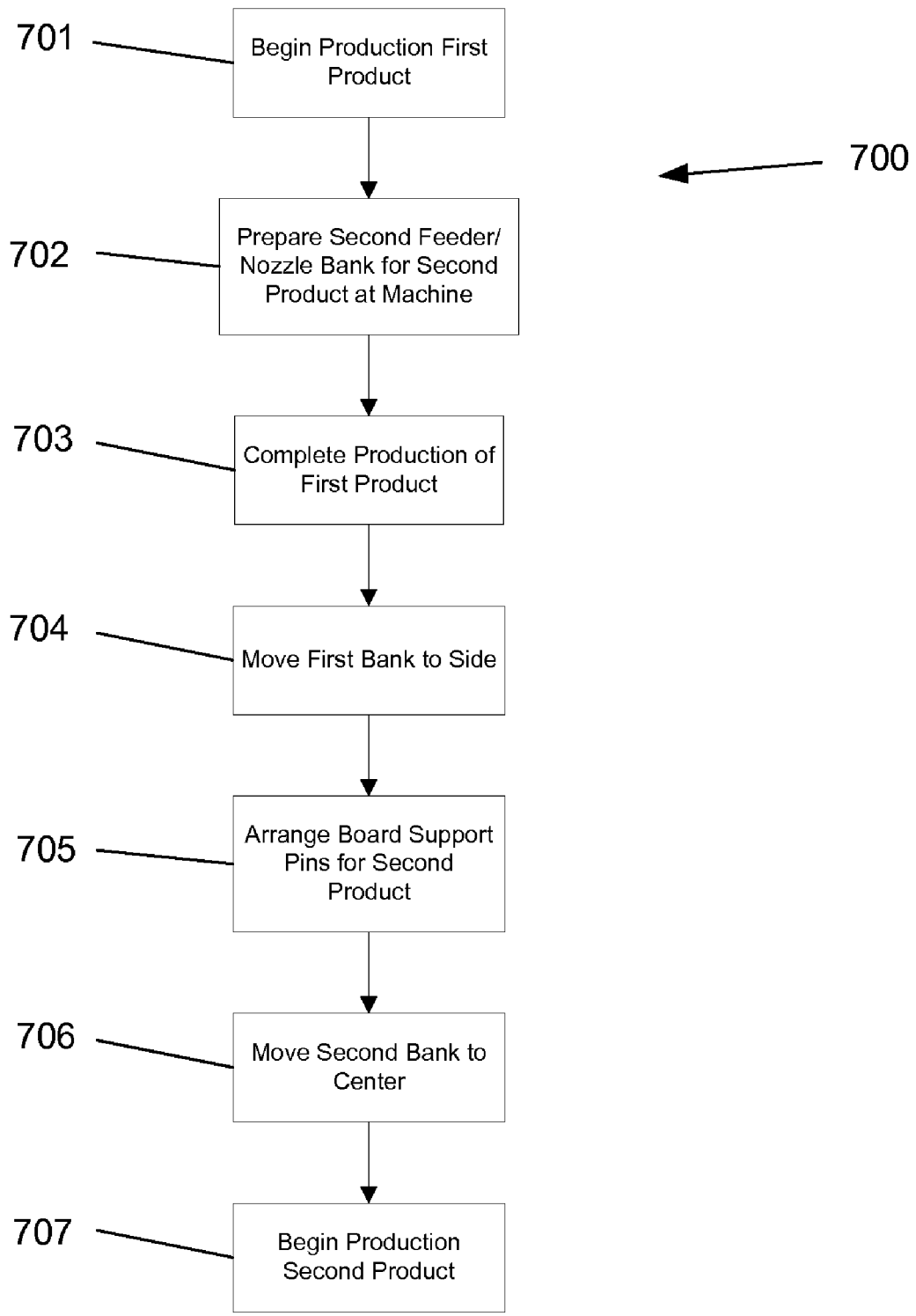

With continued reference to FIGS. 1-11 of the drawings, additional reference to FIG. 12 depicts a flowchart of an embodiment of a product changeover process 700. The steps involved in product changeover process 700 may be employed for changing from one product to another product on production line, such as production line 300, depicted in FIG. 1. Once production begins on a first product, step 701, setup may begin on production line 300 for a second product step 702. Retrieved components from a component warehouse 100 for the second product may be delivered to one or more PCB assembly machines 600 in production line 300. An operator may load the retrieved components on to feeders, place the feeders into feeder slots 512 on bank 510B located at a first position 540 and may, if required, validate that the correct components are loaded on to the correct feeders and that the correct feeders are located in the correct slots for the second product. Additionally, the operator may update the nozzle configuration for the second product and perform any necessary nozzle maintenance. Furthermore, the operator may move bank 510B to a second position 550 completing step 702. The remaining setup for the production of the second product may begin when production of the first product completes, step 703. In the product changeover process 700, the remaining setup of the second product may entail moving bank 510A to a second position 550, step 704 and arranging the board support pins within component placement machine 600, step 705. Moreover, the operator may also move bank 510B to a third position 560, step 706. The production of the second product then may then begin, step 707, and the operator may move bank 510A to a first position 540 in preparation for repeating portions of the process 700 and setting up feeder bank 510A for uninterrupted production of further PCB products.

As pertaining to the product changeover process 700 described above, the number of changeover steps, between the completion of the first product to the start of the second product, may not necessarily include the validation of the feeder banks, nor the setup and maintenance of the nozzles as this may be done in parallel with the production of the first product. This parallel setup and/or maintenance may reduce the amount of time production line 300 is not producing a product. In addition, the delivery of the retrieved components directly to production line 300 reduces the need for offline feeder setup area 200 as well as the typical feeder carts necessary to move the retrieved components from the offline feeder setup area 200 to the production line 300, thereby reducing floor space requirements and hardware costs.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A component placement machine for assembling at least one component on to at least one printed circuit board, said component placement machine comprising:
   at least one head configured for picking said component from at least one feeder and placing said picked component on to a printed circuit board of a first printed circuit board product; and
   at least one feeder bank system separate from the at least one head, the at least one feeder bank system including a first feeder bank and a second feeder bank and a positioning system for moving both the entire first feeder bank and the entire second feeder bank in both a horizontal X direction and a perpendicular horizontal Y direction, wherein said feeder bank system is configured to enable a setup of a second printed circuit board product on said component placement machine while said component placement machine assembles said printed circuit board of said first printed circuit board product;
   wherein the entire first feeder bank and the entire second feeder bank of the at least one feeder bank system are each movably located on said component placement machine independently from each other, so that movement of the entire first feeder bank occurs while said component placement machine uses the second feeder bank to assemble said printed circuit board of said first printed circuit board product.

2. The component placement machine of claim 1, wherein said first feeder bank and said second feeder bank each further comprise:
   at least one feeder slot in which a feeder may be mounted; and
   a nozzle changer in which at least one nozzle may be stored.

3. The component placement machine of claim 2, wherein said nozzle changer further comprises:
   a removable tray for storing said nozzle.

4. The component placement machine of claim 1, wherein the positioning system further comprises:
   a y axis guide configured for moving both said first feeder bank and said second feeder bank between a first position and said second position; and
   an x axis guide configured for moving both said first feeder bank and said second feeder bank between a second position and a third position.

5. The component placement machine of claim 4, wherein said first feeder bank is inaccessible by an operator when said first feeder bank is located at said second position or at said third position.

6. The component placement machine of claim 4, wherein said first feeder bank is accessible by an operator when said first feeder bank is located at said first position.

7. The component placement machine of claim 4, wherein said first feeder bank is accessible by the separate head mounted within said component placement machine when said first feeder bank is located at said third position.

* * * * *